(12) United States Patent
Sithanandam et al.

(10) Patent No.: US 11,063,429 B2
(45) Date of Patent: Jul. 13, 2021

(54) LOW LEAKAGE MOSFET SUPPLY CLAMP FOR ELECTROSTATIC DISCHARGE (ESD) PROTECTION

(71) Applicants: STMicroelectronics International N.V., Schiphol (NL); STMicroelectronics SA, Montrouge (FR)

(72) Inventors: Radhakrishnan Sithanandam, Greater Noida (IN); Divya Agarwal, Noida (IN); Ghislain Troussier, Voiron (FR); Jean Jimenez, Saint Theoffrey (FR); Malathi Kar, Delhi (IN)

(73) Assignees: STMicroelectronics International N.V., Schiphol (NL); STMicroelectronics SA, Montrouge (FR)

(*) Notice: Subject to any disclaimer, the term of this patent is extended or adjusted under 35 U.S.C. 154(b) by 477 days.

(21) Appl. No.: 15/951,806

(22) Filed: Apr. 12, 2018

(65) Prior Publication Data
US 2019/0319453 A1 Oct. 17, 2019

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0266* (2013.01); *H01L 27/0288* (2013.01)

(58) Field of Classification Search
CPC ............. H01L 27/0248; H01L 27/0251; H01L 27/0255; H01L 27/0266; H01L 27/0285; H01L 27/0288; H02H 9/04; H02H 9/042; H02H 9/046
See application file for complete search history.

(56) References Cited

U.S. PATENT DOCUMENTS

| | | | |
|---|---|---|---|
| 5,400,202 A | 3/1995 | Metz et al. | |
| 5,452,171 A | 9/1995 | Metz et al. | |
| 5,528,188 A | 6/1996 | Au et al. | |
| 6,208,494 B1 | 3/2001 | Nakura et al. | |
| 6,919,602 B2 * | 7/2005 | Lin ..................... | H01L 27/0266 257/355 |
| 7,245,468 B2 * | 7/2007 | Griesbach ........ | H03K 17/08122 361/56 |
| 7,589,945 B2 | 9/2009 | Miller et al. | |
| 8,129,788 B1 | 3/2012 | Walker et al. | |

(Continued)

FOREIGN PATENT DOCUMENTS

JP 2011176091 * 9/2011 ............. H01L 27/06

OTHER PUBLICATIONS

Chiu, Po-Yen et al: "Design of Low-Leakage Power-Rail ESD Clamp Circuit With MOM Capacitor and STSCR in a 65-nm CMOS Process," 2011 ICICIDT Conference, 4 pages.

(Continued)

*Primary Examiner* — Matthew V Nguyen
(74) *Attorney, Agent, or Firm* — Crowe & Dunlevy

(57) ABSTRACT

Electrostatic discharge (ESD) protection is provided in using a supply clamp circuit using an ESD event actuated MOSFET device. Triggering of the MOSFET device is made at both the gate terminal and the substrate (back gate) terminal. Additionally, the MOSFET device can be formed of cascoded MOSFETs.

41 Claims, 6 Drawing Sheets

(56) References Cited

U.S. PATENT DOCUMENTS

| | | |
|---|---|---|
| 8,759,871 B2 | 6/2014 | Song et al. |
| 9,401,351 B2 | 7/2016 | Jimenez et al. |
| 2002/0064007 A1 | 5/2002 | Chang et al. |
| 2005/0151160 A1 | 7/2005 | Salcedo et al. |
| 2007/0247772 A1 | 10/2007 | Keppens et al. |
| 2008/0049365 A1 | 2/2008 | Worley et al. |
| 2010/0090283 A1 | 4/2010 | Langguth et al. |
| 2010/0165523 A1* | 7/2010 | Son .................. H02H 9/046 361/56 |
| 2012/0120531 A1 | 5/2012 | Abou-Khalil et al. |
| 2014/0036399 A1 | 2/2014 | Ory et al. |
| 2014/0185167 A1 | 7/2014 | Peng et al. |
| 2015/0194420 A1 | 7/2015 | Wang et al. |
| 2015/0318275 A1 | 11/2015 | Chen et al. |
| 2016/0141287 A1 | 5/2016 | He et al. |
| 2017/0155243 A1 | 6/2017 | Tan et al. |
| 2017/0271322 A1 | 9/2017 | Russ et al. |
| 2017/0278839 A1 | 9/2017 | Lai |
| 2018/0287378 A1 | 10/2018 | Sithanandam |
| 2019/0165571 A1 | 5/2019 | Batra et al. |
| 2019/0267801 A1* | 8/2019 | Kumar .................. H02H 9/046 |
| 2019/0319453 A1 | 10/2019 | Sithanandam et al. |

OTHER PUBLICATIONS

Maloney, Timothy J. et al.: "Methods for Designing Low-Leakage Power Supply Clamps," 2003 EOS/ESD Symposium (7 pages).

Stockinger, Michael et al.: "Boosted and Distributed Rail Clamp Networks for ESD Protection in Advanced CMOS Technologies," 2003 Electrical Overstress: Electrostatic Discharge Symposium (10 pages).

Bourgeat, et al.: "Single and Compact ESD Device Beta-Matrix Solution Based on Bidirectional SCR Network in Advanced 28/32 NM Technology Node," Solid State Electronics, vol. 87, Sep. 2013 (pp. 34-42).

Sithanandam, Radhakrishnan et al: "A Novel Cascade-Free 5-V ESD Clamp Using I-MOS: Proposal and Analysis," IEEE Transactions on Device and Materials Reliabiity, vol. 16, No. 2, Jun. 2016 (pp. 200-207).

* cited by examiner

LOW LEAKAGE MOSFET SUPPLY CLAMP FOR ELECTROSTATIC DISCHARGE (ESD) PROTECTION

TECHNICAL FIELD

The present invention relates to a device for protecting an integrated circuit against overvoltages and, in particular, against electrostatic discharges.

BACKGROUND

FIG. 1 shows a circuit diagram for a conventional supply clamp circuit 10 for electrostatic discharge (ESD) protection in an integrated circuit. The supply clamp circuit 10 is formed by a switching circuit 12 coupled between a first supply line 14 of the integrated circuit and a second supply line 16 of the integrated circuit. The first supply line 14 is coupled to a positive power supply pad 22 for the integrated circuit and the second supply line 16 is coupled to a negative or ground power supply pad 24 for the integrated circuit. The supply lines could be internal nodes without pad connections. The functional circuit 28 to be protected is also coupled between the first supply line 14 and the second supply line 16. The switching circuit 12 has a first conduction terminal 32 coupled to the first supply line 14 and a second conduction terminal 34 coupled to the second supply line 16. A control terminal 36 of the switching circuit 12 receives a trigger signal generated by a trigger circuit 40 that senses a transient voltage difference in the first or second supply lines 14 and 16, respectively, and asserts the trigger signal in response to the sensed difference. In an embodiment, the switching circuit 12 comprises an n-channel MOSFET device with the first conduction terminal 32 being the drain terminal, the second conduction terminal 34 being the source terminal (also connected to the transistor substrate-body terminal) and the control terminal 36 being the gate terminal. The trigger circuit 40 comprises an ESD detection circuit 42 and a trigger signal conditioning circuit 44. The ESD detection circuit 42 is formed by a resistive-capacitive (RC) circuit comprising a resistor 50 connected in series with a capacitor 52 between the first and second supply lines 14 and 16. A first terminal of the resistor 50 is connected to the second supply line 16 and a second terminal of the resistor 50 is connected to node 56. A first plate of the capacitor 52 is connected to node 56 and a second plate of the capacitor 52 is connected to the first supply line 14. The trigger signal conditioning circuit 44 comprises first and second inverter circuits 60 and 62, respectively, connected in series with each other. The inverter circuits 60 and 62 are powered from the first and second supply lines 14 and 16, with an input of the inverter circuit 60 connected to node 56, an output of inverter circuit 60 connected to an input of inverter circuit 62 and an output of inverter circuit 62 connected to the control terminal 36 of the switching circuit 12. In some implementations, the trigger signal conditioning circuit 44 may be omitted with node 56 directly connected to the gate terminal of the switching circuit 12.

In other implementations, the trigger signal conditioning may be made of a single stage inverter connected to a reversed RC detector. This reversed RC detector may be connected as follows, a first terminal of the resistor 50 may be connected to the second supply line 14 and a second terminal of the resistor 50 may be connected to node 56. A first plate of the capacitor 52 may be connected to node 56 and a second plate of the capacitor 52 may be connected to the first supply line 16. An output of the single stage inverter may be connected to the gate terminal 36 of the switching circuit 12, and an input of the single stage inverter may be connected to the node 56.

FIG. 2 illustrates the results of an Eldo Simulation of the human body model (HBM) response of the conventional supply clamp circuit 10 using the standard HBM circuit. The performance parameters are as follows: $V_{transient}$=1.02V @SSA, −40° C.; and $V_{HBM}$=0.98V @TT, 25° C.

A concern with the conventional supply clamp circuit 10 is that there is an unacceptable level of DC leakage at the supply pads or, more generally, in between supply line 14 and supply line 16, as well as unacceptable transient peaks. Solutions to these problems have involved the use of high threshold transistors or snap-back devices (like silicon controlled rectifiers—SCRs). Some solutions are expensive to implement and other solutions occupy large circuit area. There is a need in the art to provide a supply clamp circuit for ESD protection that addresses the foregoing and other problems.

SUMMARY

In an embodiment, an electrostatic discharge (ESD) protection circuit comprises: a first power supply line; a second power supply line; a MOSFET switching circuit having a first conduction terminal connected to the first power supply line, a second conduction terminal connected to the second power supply line, a gate control terminal and a substrate terminal; and a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit.

The trigger circuit may comprise a first resistive-capacitive ESD detection circuit configured to generate the first trigger signal and a second resistive-capacitive ESD detection circuit configured to generate the second trigger signal, where an RC time constant of the second resistive-capacitive ESD detection circuit is smaller than an RC time constant of the first resistive-capacitive ESD detection circuit.

The trigger circuit may alternatively comprise a resistive-capacitive ESD detection circuit configured to generate an ESD detection signal and a signal conditioning circuit having an input coupled to receive the ESD detection signal, a first output configured to generate the first trigger signal and a second output configured to generate the second trigger signal. The signal conditioning circuit may be formed by a plurality of coupled inverter circuits.

The trigger circuit may alternatively comprise a resistive-capacitive ESD detection circuit configured to generate an ESD detection signal, a first inverter circuit having an input coupled to receive the ESD detection signal, a second inverter circuit having an input coupled to an output of the first inverter circuit and an output configured to generate the first trigger signal, and a MOSFET device having a first conduction terminal connected to the first power supply line, a second conduction terminal connected to the substrate terminal of the MOSFET switching circuit and a gate terminal coupled to the output of the first inverter circuit.

The circuit may further include a MOSFET device having a first conduction terminal connected to the gate control terminal of the MOSFET switching circuit, a second conduction terminal connected to the second power supply line, and a gate terminal connected to the first power supply line.

In an embodiment, an electrostatic discharge (ESD) protection circuit comprises: a first power supply line; a second power supply line; a first MOSFET device; a second MOSFET device; wherein source-drain paths of the first and second MOSFET devices are connected in series between the first and second power supply lines; and a trigger circuit configured to generate, in response to detection of an ESD event at one or more of the first and second power supply lines, one or more trigger signals for application to gate terminals of the first and second MOSFET devices.

The trigger circuit may comprise a resistive-capacitive ESD detection circuit configured to generate an ESD detection signal, a first inverter circuit having an input coupled to receive the ESD detection signal, and a second inverter circuit having an input coupled to an output of the first inverter circuit and an output configured to generate the trigger signal applied to the gate terminals of both the first and second MOSFET devices.

The trigger circuit may generate a first trigger signal for application to gate terminal of the first MOSFET device and a second trigger signal for application to the gate terminal of the second MOSFET device.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 3:
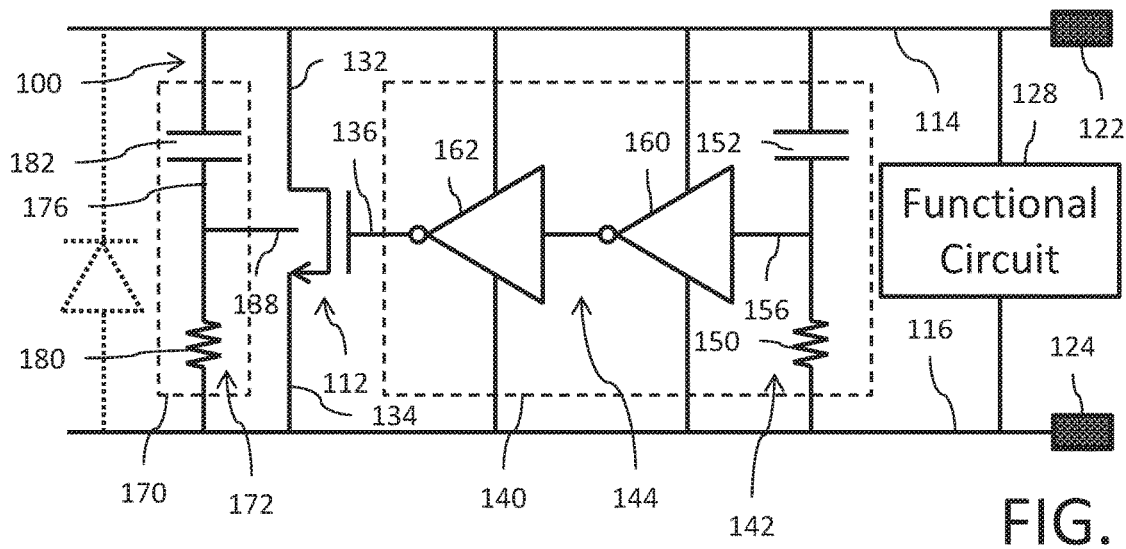
FIG. 3 shows a circuit diagram for a supply clamp circuit for ESD protection.

Reference is now made to FIG. 3 showing a circuit diagram for a supply clamp circuit 100 for ESD protection in an integrated circuit. The supply clamp circuit 100 is formed by a switching circuit 112 coupled between a first supply line 114 of the integrated circuit and a second supply line 116 of the integrated circuit. The first supply line 114 is coupled to a positive power supply pad 122 for the integrated circuit and the second supply line 116 is coupled to a negative or ground power supply pad 124 for the integrated circuit or may be internal nodes only without pad connections. The functional circuit 128 to be protected is also coupled between the first supply line 114 and the second supply line 116. The switching circuit 112 has a first conduction terminal 132 coupled to the first supply line 114 and a second conduction terminal 134 coupled to the second supply line 116. A first control terminal 136 of the switching circuit 112 receives a first trigger signal generated by a first trigger circuit 140 that senses a transient voltage difference in the first or second supply lines 114 and 116, respectively, and thus detects an ESD event. The first trigger signal is asserted in response to the sensed ESD event. In an embodiment, the switching circuit 112 comprises an n-channel MOSFET device with the first conduction terminal 132 being the drain terminal, the second conduction terminal 134 being the source terminal and the first control terminal 136 being the gate terminal. A back gate (or body terminal) 138 of the MOSFET device switching circuit 112 forms a second control terminal and receives a second trigger signal generated by a second trigger circuit 170 that senses the transient voltage difference in the first or second supply lines 114 and 116, respectively, to also detect the ESD event. The second trigger signal is asserted in response to the sensed ESD event.

The first trigger circuit 140 comprises an ESD detection circuit 142 and a trigger signal conditioning circuit 144. The ESD detection circuit 142 is formed by a resistive-capacitive (RC) circuit comprising a resistor 150 connected in series with a capacitor 152 between the first and second supply lines 114 and 116. A first terminal of the resistor 150 is connected to the second supply line 116 and a second terminal of the resistor 150 is connected to node 156. A first plate of the capacitor 152 is connected to node 156 and a second plate of the capacitor 152 is connected to the first supply line 114. The trigger signal conditioning circuit 144 comprises first and second inverter circuits 160 and 162, respectively, connected in series with each other. The inverter circuits 160 and 162 are powered from the first and second supply lines 114 and 116, with an input of the inverter circuit 160 connected to node 156, an output of inverter circuit 160 connected to an input of inverter circuit 162 and an output of inverter circuit 162 connected to the control terminal 136 of the switching circuit 112. In an embodiment, the trigger signal conditioning circuit 144 may be omitted and the node 156 directly connected to the gate terminal of the MOSFET device switching circuit 112.

The second trigger circuit 170 comprises an ESD detection circuit 172 formed by a resistive-capacitive (RC) circuit comprising a resistor 180 connected in series with a capacitor 182 between the first and second supply lines 114 and 116. A first terminal of the resistor 180 is connected to the second supply line 116 and a second terminal of the resistor 180 is connected to node 176. A first plate of the capacitor 182 is connected to node 176 and a second plate of the capacitor 182 is connected to the first supply line 114. The second trigger signal is generated at the node 176 which is connected to the back gate (body terminal) 138 of the MOSFET device switching circuit 112. This second trigger signal 176 may be directly connected to the node 138 (body terminal or back gate) or indirectly connected to the node 138 through a trigger circuit conditioning based on inverters.

The circuit 100 may further include a return diode (shown by the dotted diode circuit) connected between the first and second supply lines 114 and 116 in a manner well known to those skilled in the art with the cathode terminal connected to the first supply line 114 and the anode terminal connected to the second supply line 116.

In the FIG. 3 supply clamp circuit 100, the control terminal 136 (gate terminal) and substrate back gate (body terminal) 138 of the MOSFET device switching circuit 112 are driven by distinct triggering circuits. The RC time constant of the resistive-capacitive (RC) circuit comprising resistor 180 and capacitor 182 in second trigger circuit 170 is smaller than the RC time constant of the resistive-capacitive (RC) circuit comprising resistor 150 and capacitor 152 in first trigger circuit 140. The second trigger circuit 170 comprising ESD detection circuit 172 operates to forward bias the substrate back gate (body terminal) 138 of the MOSFET device switching circuit 112 during ESD events. At all other times, the resistor 180 ties the substrate back gate (body terminal) 138 to ground at the second supply line 116.

The circuit 100 of FIG. 3 may be fabricated as an integrated circuit in an implementation where the trigger circuits and return diode are implemented in a portion using fully-depleted silicon on insulator (FDSOI) of finFET on SOI technology while the MOSFET switching circuit is implemented either in the SOI area or in a hybrid area. In this context, the "hybrid area" refers to a not SOI area in the integrated circuit made in SOI technology. Hybrid areas are like bulk area inclusions in an integrated circuit made in SOI technology.

Figure 2:
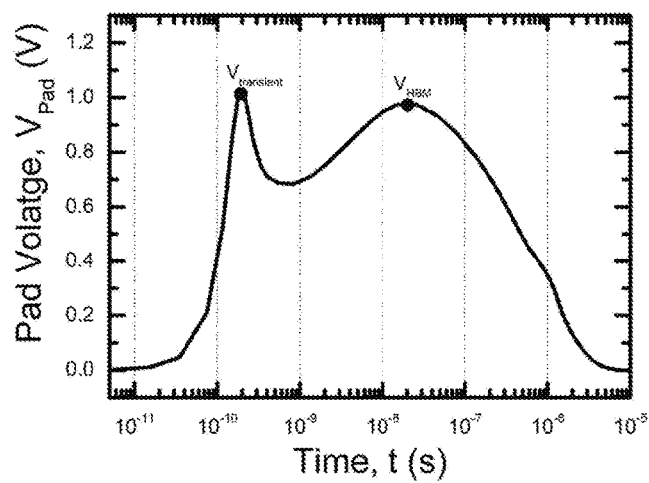
FIG. 2 illustrates the results of an Eldo Simulation of the FIG. 1 circuit.
Figure 4:
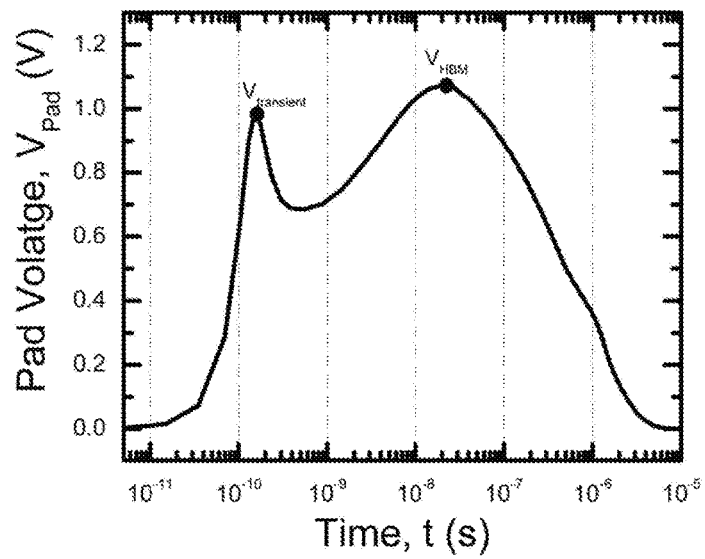
FIG. 4 illustrates the results of an Eldo Simulation of the FIG. 3 circuit.

FIG. 4 illustrates the results of an Eldo Simulation of the human body model (HBM) response of the supply clamp circuit 100 using the standard HBM circuit. The performance parameters are as follows: $V_{transient}$=0.99V @SSA, −40° C.; and $V_{HBM}$=1.11V @TT, 25° C. Compared to the FIG. 2, the circuit of FIG. 4 shows a quite similar response face to an ESD HBM event but obtained with a smaller MOSFET device switching circuit 112. The gain of the proposed solution resides in the ESD protection footprint saving and the leakage decreasing.

Figure 5:
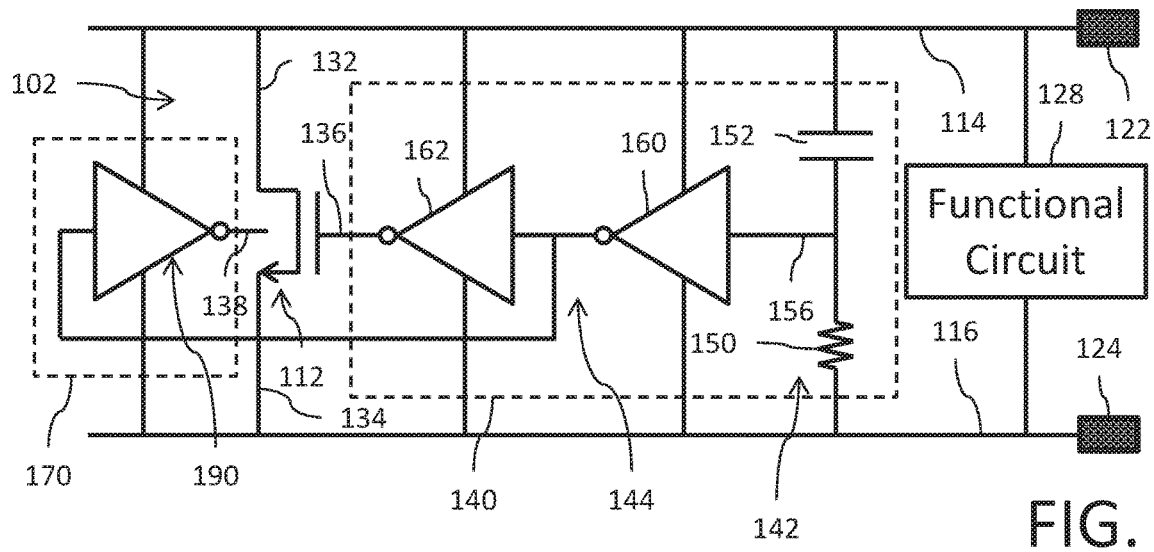
FIG. 5 shows a circuit diagram for a supply clamp circuit for ESD protection.

Reference is now made to FIG. 5 showing a circuit diagram for a supply clamp circuit 102 for ESD protection in an integrated circuit. Like reference numbers in FIGS. 3 and 5 refer to like or similar components. The circuit 102 differs from the circuit 100 in that the ESD detection circuit 172 of the second trigger circuit 170 has been replaced by a third inverter circuit 190 that is powered from the first and second supply lines 114 and 116 and driven by the first trigger circuit. An input of the inverter circuit 190 is connected to the output of the first inverter circuit 160 and an output of the third inverter circuit 190 generates the second trigger signal and is connected to the substrate back gate (body terminal) 138 of the n-channel MOSFET device switching circuit 112. The second trigger circuit 170 comprising inverter circuit 190 operates to forward bias the substrate back gate (body terminal) 138 of the MOSFET device switching circuit 112 during ESD events through the pull up transistor of the inverter circuit 190. At all other times, the pull down transistor of the inverter circuit 190 ties the substrate back gate (body terminal) 138 to ground at the second supply line 116. The circuit 102 may further include a return diode (as shown by the dotted diode circuit in FIG. 3) connected between the first and second supply lines 114 and 116 in a manner well known to those skilled in the art.

The circuit 102 of FIG. 5 may be fabricated as an integrated circuit in an implementation where the trigger circuits and return diode are implemented in a portion using fully-depleted silicon on insulator (FDSOI) of finFET on SOI technology while the MOSFET switching circuit is implemented in either the SOI area or the hybrid area.

Figure 6:
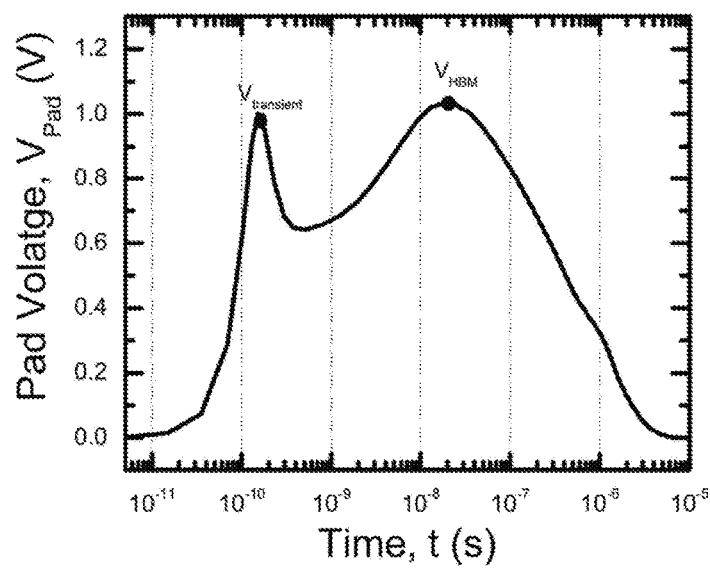
FIG. 6 illustrates the results of an Eldo Simulation of the FIG. 5 circuit.

FIG. 6 illustrates the results of an Eldo Simulation of the human body model (HBM) response of the supply clamp circuit 102 using the standard HBM circuit. The performance parameters are as follows: $V_{transient}$=1.0V @SSA, −40° C.; and $V_{HBM}$=1.03V @TT, 25° C. Compared to the FIG. 2, the circuit of FIG. 6 shows a quite similar response face to ESD HBM event but obtained with a smaller MOSFET device switching circuit 112. The gain of the proposed solution resides in the ESD protection footprint saving and the leakage decreasing.

Figure 7:
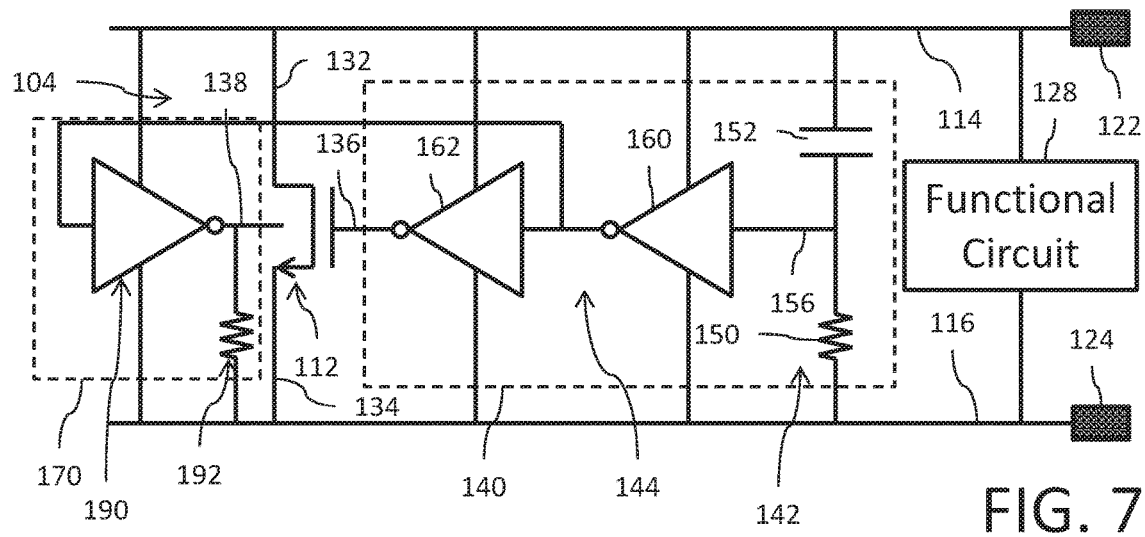
FIG. 7 shows a circuit diagram for a supply clamp circuit for ESD protection.

Reference is now made to FIG. 7 showing a circuit diagram for a supply clamp circuit 104 for ESD protection in an integrated circuit. Like reference numbers in FIGS. 5 and 7 refer to like or similar components. The circuit 104 differs from the circuit 102 in that the second trigger circuit 170 further includes a pull down resistor 192 connected between the substrate back gate (body terminal) 138 and the second supply line 116. More specifically, a first terminal of the resistor 192 is connected to the substrate back gate (body terminal) 138 and a second terminal of the resistor 192 is connected to the second supply line 116. The second trigger circuit 170 comprising inverter circuit 190 operates to forward bias the substrate back gate (body terminal) 138 of the n-channel MOSFET device switching circuit 112 during ESD events through the pull up transistor of the inverter circuit 190. At all other times, the pull down transistor of the inverter circuit 190 ties the substrate back gate (body terminal) 138 to ground at the second supply line 116. The resistor 192 functions to finely control the sensitivity of the parasitic bipolar effect of the MOSFET device switching circuit 112 (referred to as BIMOS by those skilled in the art). The circuit 104 may further include a return diode (as shown by the dotted diode circuit in FIG. 3) connected between the first and second supply lines 114 and 116 in a manner well known to those skilled in the art.

Figure 1:
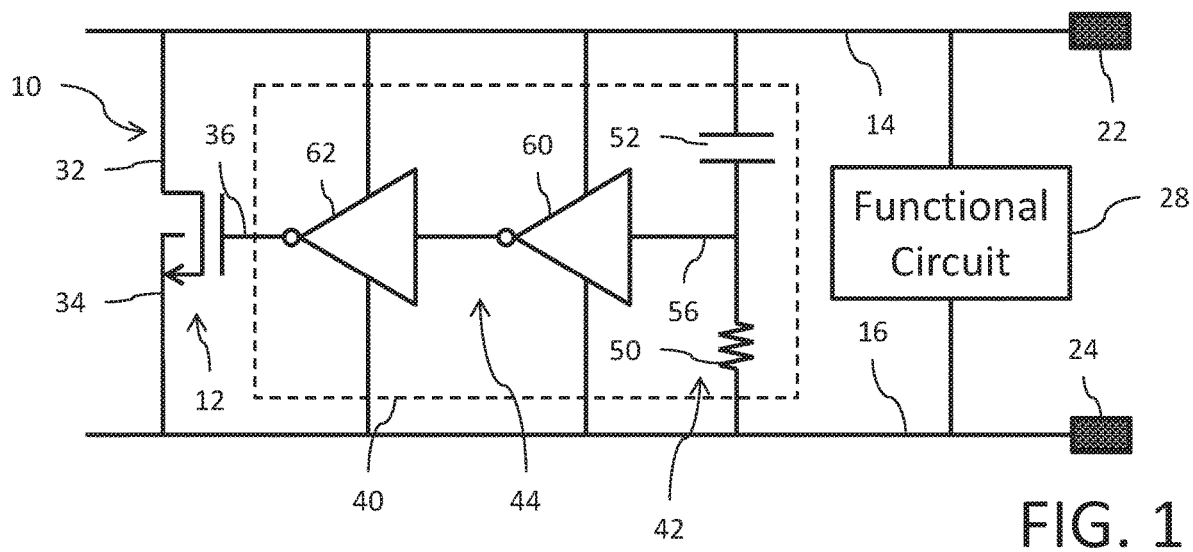
FIG. 1 shows a circuit diagram for a conventional supply clamp circuit for electrostatic discharge (ESD) protection.

The circuit 104 of FIG. 7 may be fabricated as an integrated circuit in an implementation where the trigger circuits and return diode are implemented in a portion using fully-depleted silicon on insulator (FDSOI) of finFET on SOI technology while the MOSFET switching circuit is implemented in either the SOI area or the hybrid area. With respect to the parasitic bipolar effect of the MOSFET device switching circuit 112, in an embodiment, the parasitic bipolar transistor of the MOSFET may be implemented using an insulated P type doped well made of deep (buried) N type doped well surrounded by N type doped well walls which is well known manner of insulating devices in bulk or hybrid areas. Parasitic bipolar transistors in parallel of a MOSFET are represented on the FIG. 12. An advantage of this implementation is that a MOSFET with a smaller width can be used with activation of the parasitic bipolar to help carry the ESD current. As an example, the width of the MOSFET is FIG. 1 is 3500 μm while the width of the MOSFET in FIG. 7 is 2700 μm.

Figure 8:
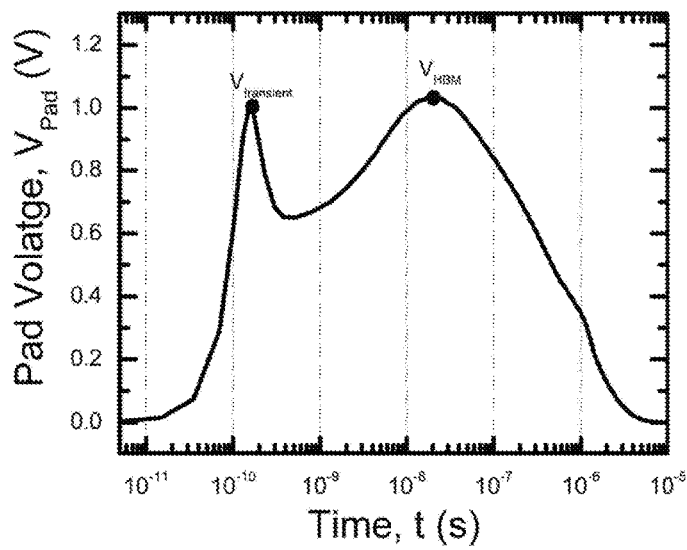
FIG. 8 illustrates the results of an Eldo Simulation of the FIG. 7 circuit.

FIG. 8 illustrates the results of an Eldo Simulation of the human body model (HBM) response of the supply clamp circuit 104 using the standard HBM circuit. The performance parameters are as follows: $V_{transient}$=1.0V @SSA, −40° C.; and $V_{HBM}$=1.04V @TT, 25° C. Compared to the FIG. 2, the circuit of FIG. 8 shows a quite similar response face to ESD HBM event but obtained with a smaller MOSFET device switching circuit 112 as explained previously. The gain of the proposed solution resides in the ESD protection footprint saving and the leakage decreasing.

Figure 9:
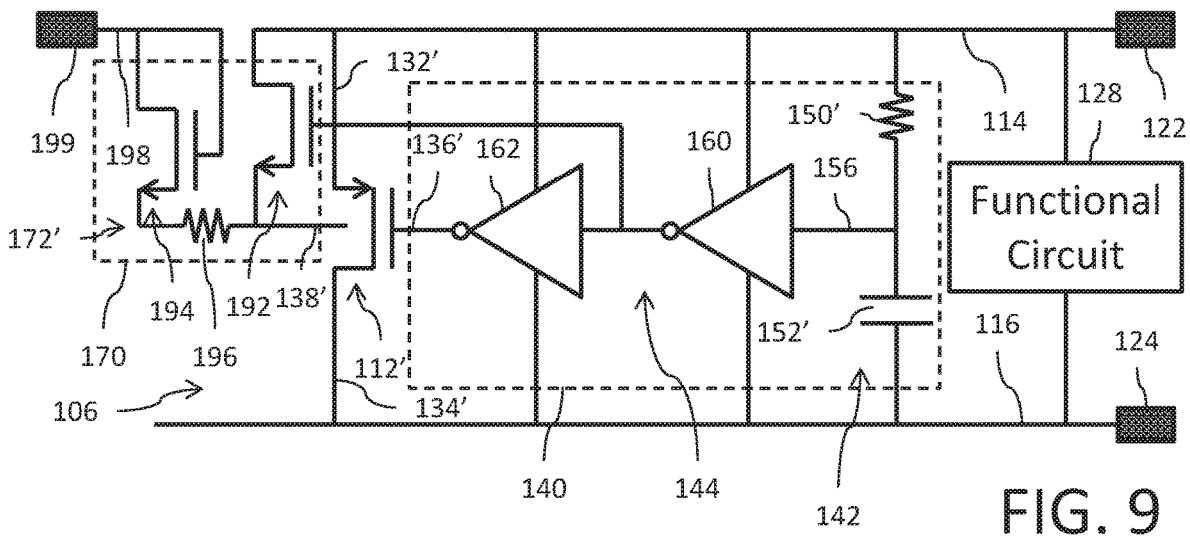
FIG. 9 shows a circuit diagram for a supply clamp circuit for ESD protection.

Reference is now made to FIG. 9 showing a circuit diagram for a supply clamp circuit 106 for ESD protection in an integrated circuit. Like reference numbers in FIGS. 3 and 9 refer to like or similar components. The circuit 106 differs from the circuit 100 in the following ways:

First, the polarization of the ESD detection circuit 142 is flipped in comparison to FIG. 3. Here, the resistive-capacitive (RC) circuit comprises a resistor 150' connected in series with a capacitor 152' between the first and second supply lines 114 and 116. A first terminal of the resistor 150' is connected to the first supply line 114 and a second terminal of the resistor 150' is connected to node 156. A first plate of the capacitor 152' is connected to node 156 and a second plate of the capacitor 152' is connected to the second supply line 114.

Second, the n-channel MOSFET device switching circuit 112 is replaced with a p-channel MOSFET device switching circuit 112'. The switching circuit 112' has a first conduction terminal 132' (a source terminal) coupled to the first supply line 114 and a second conduction terminal 134' (a drain terminal) coupled to the second supply line 116. A control terminal 136' (gate terminal) of the switching circuit 112' receives the first trigger signal generated by the first trigger circuit 140. A back gate (body terminal) 138' of the MOSFET device switching circuit 112' receives the second trigger signal generated by the second trigger circuit 170.

Third, the ESD detection circuit 172 of the second trigger circuit 170 has been replaced by dynamic bias control circuit 172' for implementing reverse body biasing. The circuit 172' is formed by a first n-channel MOSFET device 192, a second n-channel MOSFET device 194 and a resistor 196. The first n-channel MOSFET device 192 has a drain terminal connected to the first supply line 114 and a source terminal connected to the back gate (body terminal) 138' of the MOSFET device switching circuit 112'. The gate of the first n-channel MOSFET device 192 is connected to receive the trigger signal output from the inverter 160. A first terminal of the resistor 196 is also connected to the back gate (body terminal) 138' of the MOSFET device switching circuit 112'. The second n-channel MOSFET device 194 has its gate and drain terminals both connected to a third supply line 198 and its source terminal connected to a second terminal of the resistor 196. The third supply line 198 is associated with a supply pad 199, or may be internal nodes only without pad connections, for a voltage that is higher than a voltage associated with the first supply line 114. As an example, the supply voltage associated with the third supply line may be 3.3V while the supply voltage associated with the first supply line 114 may be 1.8V.

The circuit 106 may further include a return diode (as shown by the dotted diode circuit of FIG. 3) connected between the first and second supply lines 114 and 116 in a manner well known to those skilled in the art.

During an ESD event, the first n-channel MOSFET device 192 of the dynamic bias control circuit responds to the signal at the output of the first inverter circuit 160 and pulls the back gate (body terminal) 138' of the MOSFET device switching circuit 112' to the first supply line 114. Conversely, during normal operation, the back gate (body terminal) 138' of the MOSFET device switching circuit 112' is biased through the diode-connected second n-channel MOSFET device 194 and resistor 196 to the third supply line 198. This places the back gate (body terminal) 138' of the MOSFET device switching circuit 112' at a higher potential than the drain terminal resulting in the reverse body biasing (RBB) configuration which reduces leakage current.

The circuit 106 of FIG. 9 may be fabricated as an integrated circuit in an implementation where the trigger circuits and return diode are implemented in a portion using fully-depleted silicon on insulator (FDSOI) of finFET on SOI technology, and the MOSFET switching circuit is implemented in either the SOI area or the hybrid area.

Figure 10:
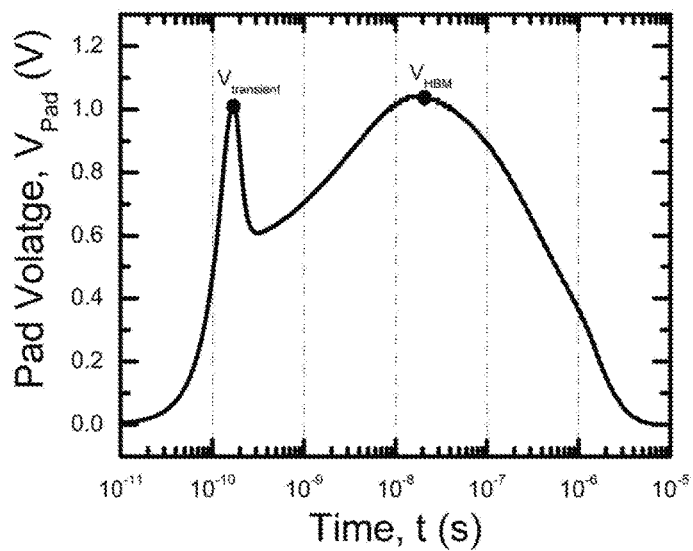
FIG. 10 illustrates the results of an Eldo Simulation of the FIG. 9 circuit.

FIG. 10 illustrates the results of an Eldo Simulation of the human body model (HBM) response of the supply clamp circuit 106 using the standard HBM circuit. The performance parameters are as follows: $V_{transient}=1.15V$ @SSA, $-40°$ C.; and $V_{HBM}=1.1V$ @TT, $25°$ C. The interest of this configuration resides in the leakage improvement of such an ESD circuit protection by higher reverse back bias voltage.

Figure 11:
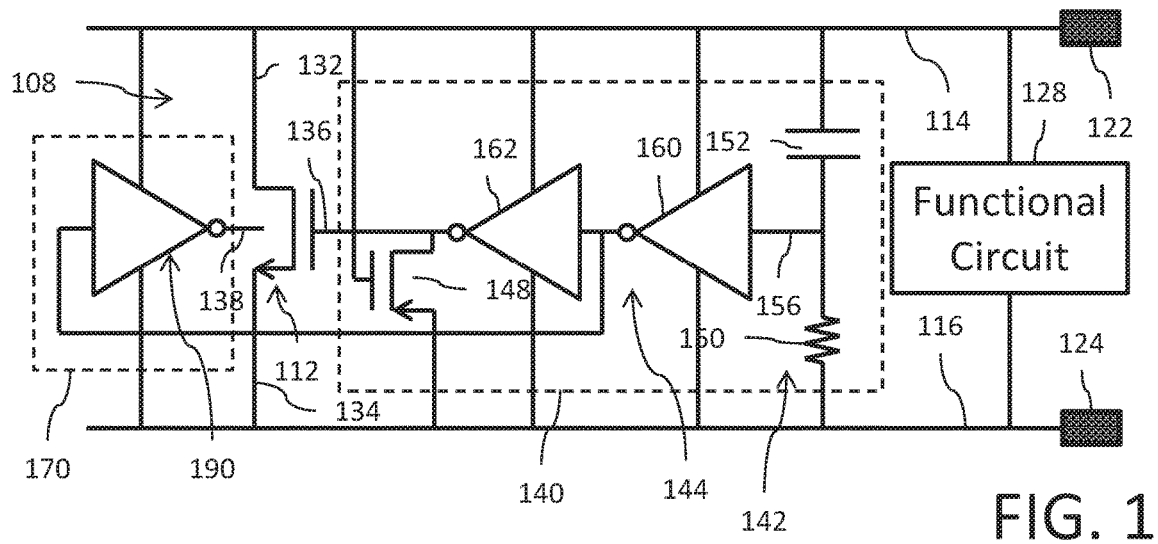
FIG. 11 shows a circuit diagram for a supply clamp circuit for ESD protection.

Reference is now made to FIG. 11 showing a circuit diagram for a supply clamp circuit 108 for ESD protection in an integrated circuit. Like reference numbers in FIGS. 5 and 11 refer to like or similar components. The circuit 108 differs from the circuit 102 in that the first trigger circuit 140 further includes a p-channel MOSFET device 148 having a first conduction terminal (drain terminal) connected to the control terminal 136 of the n-channel MOSFET device switching circuit 112, a second conduction terminal (source terminal) connected to the second supply line 116, and a control terminal (gate terminal) connected to the first supply line 114. The p-channel MOSFET device 148 functions as a pull down device for triggering of the MOSFET device switching circuit 112 in response to negative ESD stress. An advantage of this configuration is that it eliminates the need for a dedicated return diode connected between the first supply line 114 and second supply line 116 (i.e., where the return diode includes a cathode terminal connected to the first supply line 114 and an anode terminal connected to the second supply line 116; see dotted circuit shown in FIG. 3).

The circuit 108 of FIG. 11 may be fabricated as an integrated circuit in an implementation where the trigger circuits are implemented in a portion using fully-depleted silicon on insulator (FDSOI) of finFET on SOI technology and the MOSFET switching circuit is implemented in either the SOI area or in the hybrid area.

Figure 12A:
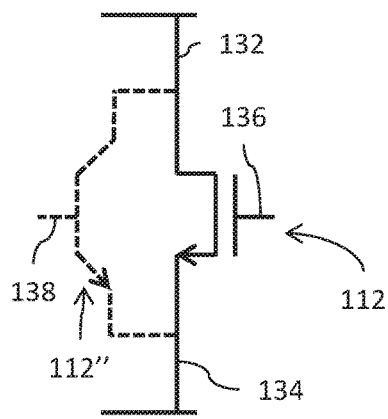
FIGS. 12A-12B illustrate parasitic bipolar configurations.
Figure 12B:
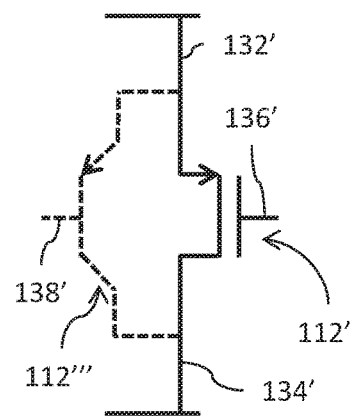

The MOSFET device switching circuits 112 and 112' used in FIGS. 3, 5, 7, 9 and 11 may advantageously be fabricated in a manner to comprise a MOSFET and a parasitic bipolar transistor 112" and 112'" as schematically shown in FIGS. 12A-12B. The base terminal of the parasitic bipolar is formed by the back gate (body terminal) 138 and 138' of the MOSFET, with the emitter corresponding to the source terminal 132' or 134 and the collector corresponding to the drain terminal 132 or 134'.

Figure 13:
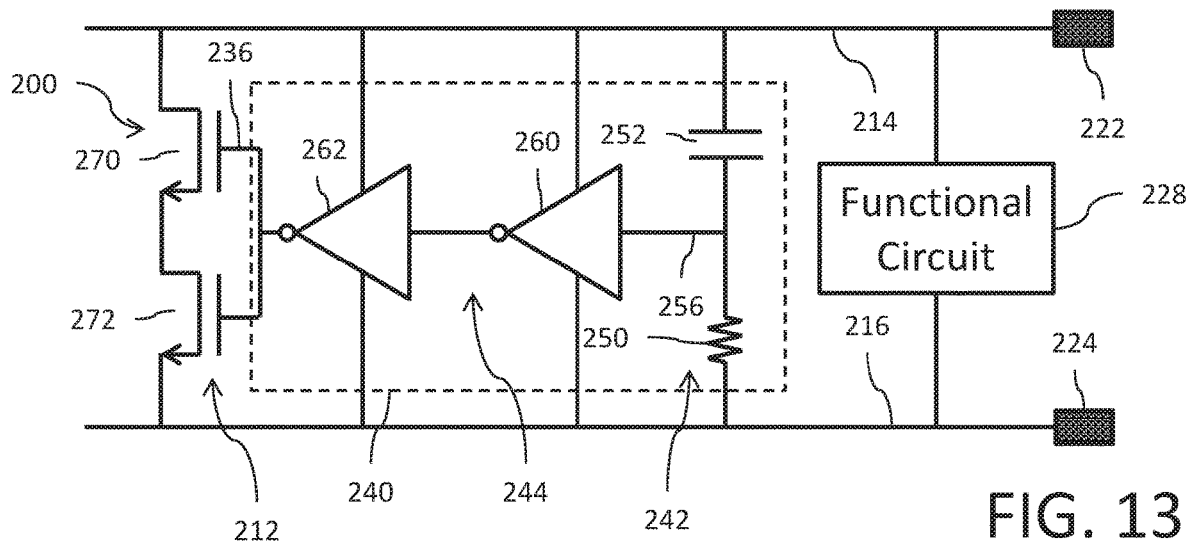
FIG. 13 shows a circuit diagram for a supply clamp circuit for ESD protection.

Reference is now made to FIG. 13 showing a circuit diagram for a supply clamp circuit 200 for ESD protection in an integrated circuit. The supply clamp circuit 200 is formed by a switching circuit 212 coupled between a first supply line 214 of the integrated circuit and a second supply line 216 of the integrated circuit. The first supply line 214 is coupled to a positive power supply pad 222 for the integrated circuit and the second supply line 216 is coupled to a negative or ground power supply pad 224 for the integrated circuit or may be internal nodes only without pad connections. The functional circuit 228 to be protected is also coupled between the first supply line 214 and the second supply line 216. The switching circuit 212 comprises a first transistor 270 and a second transistor 272 coupled in series with each other. More specifically, the first and second transistors are n-channel MOSFET devices with the source-drain paths of the MOSFET devices connected in series between the first and second supply lines 214 and 216. A drain terminal of the first transistor 270 is connected to the first supply line 214 and a source terminal of the first transistor 270 is connected to a drain terminal of the second transistor 272. A source terminal of the second transistor 272 is connected to the second supply line 216. The control terminals 236 of the first and second transistors 270 and 272 receive a trigger signal generated by a trigger circuit 240 that senses a transient voltage difference in the first or second supply lines 214 and 216, respectively, and detects an ESD event. The trigger signal is then asserted in response to the sensed ESD event.

The trigger circuit 240 comprises an ESD detection circuit 242 and a trigger signal conditioning circuit 244. The ESD detection circuit 242 is formed by a resistive-capacitive (RC) circuit comprising a resistor 250 connected in series with a capacitor 252 between the first and second supply lines 214 and 216. A first terminal of the resistor 250 is connected to the second supply line 216 and a second terminal of the resistor 250 is connected to node 256. A first plate of the capacitor 252 is connected to node 256 and a second plate of the capacitor 252 is connected to the first supply line 214. The trigger signal conditioning circuit 244 comprises first and second inverter circuits 260 and 262, respectively, connected in series with each other. The inverter circuits 260 and 262 are powered from the first and second supply lines 214 and 216, with an input of the inverter circuit 260 connected to node 256, an output of inverter circuit 260 connected to an input of inverter circuit 262 and an output of inverter circuit 262 connected to the control terminals 236 of the first and second transistors of the switching circuit 212. In an embodiment, the trigger signal conditioning circuit 244 may be omitted and the node 256 is then connected to the gate terminals of the first and second transistors 270 and 272.

The circuit 200 may further include a return diode (as shown by the dotted diode circuit of FIG. 3) connected between the first and second supply lines 214 and 216 in a manner well known to those skilled in the art.

The circuit 200 of FIG. 13 may be fabricated as an integrated circuit in an implementation where the trigger circuits, switching circuit, and return diode are implemented in a portion using fully-depleted silicon on insulator (FDSOI) of finFET on SOI technology.

Figure 14:
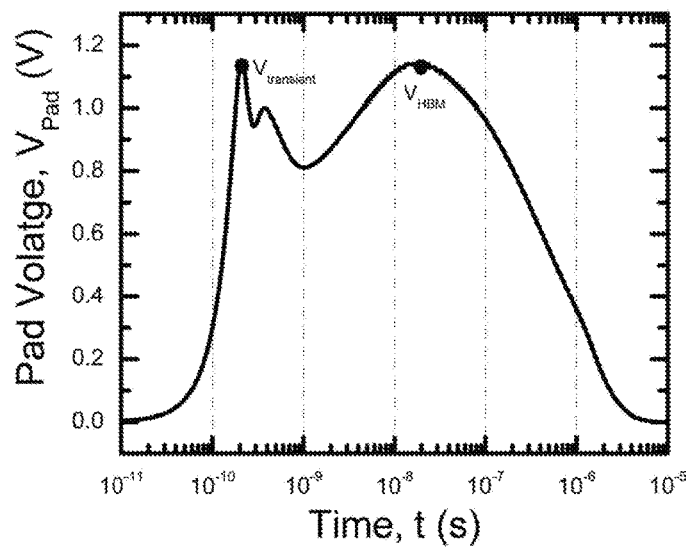
FIG. 14 illustrates the results of an Eldo Simulation of the FIG. 13 circuit.

FIG. 14 illustrates the results of an Eldo Simulation of the human body model (HBM) response of the supply clamp circuit 200 using the standard HBM circuit. The performance parameters are as follows: $V_{transient}$=1.15V @SSA, −40° C.; and $V_{HBM}$=1.1V @TT, 25° C. The switching circuit 212 reacts in the same manner than previous supply clamp circuit for ESD protection but with the capability to sustain higher power supply voltage.

Figure 15:
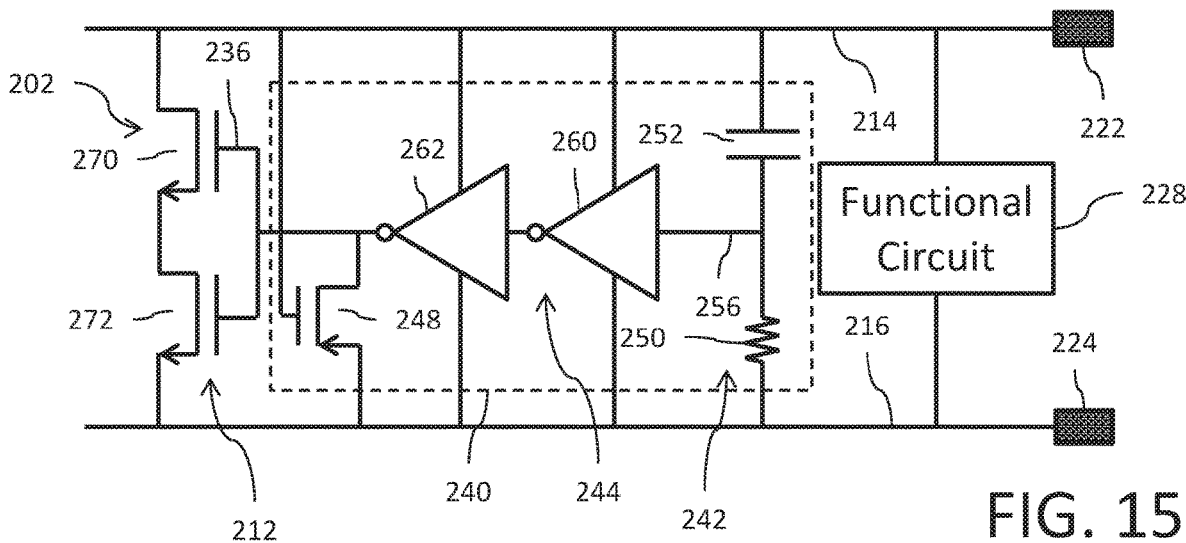
FIG. 15 shows a circuit diagram for a supply clamp circuit for ESD protection.

Reference is now made to FIG. 15 showing a circuit diagram for a supply clamp circuit 202 for ESD protection in an integrated circuit. Like reference numbers in FIGS. 13 and 15 refer to like or similar components. The circuit 202 differs from the circuit 200 in that the trigger circuit 240 further includes a p-channel MOSFET device 248 having a first conduction terminal (drain terminal) connected to the control terminal 236 of the switching circuit 212, a second conduction terminal (source terminal) connected to the second supply line 216, and a control terminal (gate terminal) connected to the first supply line 214. The p-channel MOSFET device 248 functions as a pull down device for triggering of the switching circuit 212 in response to negative ESD stress. An advantage of this configuration is that it eliminates the need for a dedicated return diode connected between the first supply line 214 and second supply line 216 (i.e., where the return diode includes a cathode terminal connected to the first supply line 214 and an anode terminal connected to the second supply line 216; see FIG. 3).

The circuit 202 of FIG. 15 may be fabricated as an integrated circuit in an implementation where the trigger circuits and switching circuit are implemented in a portion using fully-depleted silicon on insulator (FDSOI) of finFET on SOI technology.

Figure 16:
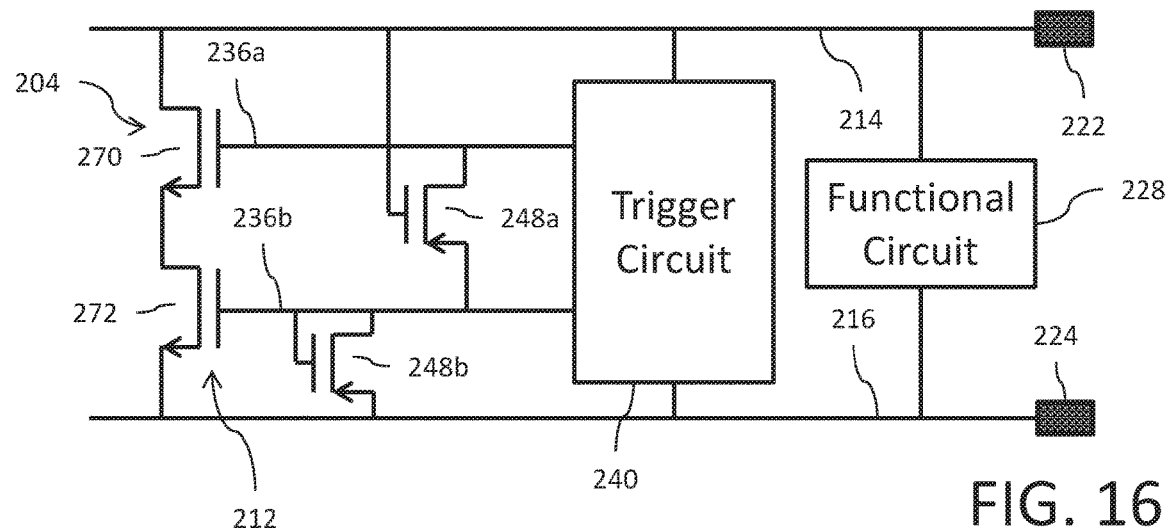
FIG. 16 shows a circuit diagram for a supply clamp circuit for ESD protection.

FIG. 16 shows an alternative implementation of a supply clamp circuit 204 for ESD protection. Like reference numbers in FIGS. 13, 15 and 16 refer to like or similar components. In FIG. 16, the trigger circuit 240' is configured to generate a first trigger signal for application to the control terminal (gate) of the MOSFET device 270 and generate a second trigger signal for application to the control terminal (gate) of the MOSFET device 272. In this configuration, a first p-channel MOSFET device 248a has a first conduction terminal (drain terminal) connected to the control terminal 236a of the transistor 270, a second conduction terminal (source terminal) connected to the control terminal 236b of the transistor 272, and a control terminal (gate terminal) connected to the first supply line 214. A second p-channel MOSFET device 248b has a first conduction terminal (drain terminal) connected to the control terminal 236b of the transistor 272, a second conduction terminal (source terminal) connected to the second supply line 216, and a control terminal (gate terminal) connected to the control terminal 236b of the transistor 272.

The circuit solution of FIGS. 13, 15 and 16 is scalable as needed based on power supply voltage level. For example, the solution of FIGS. 13, 15 and 16 may support a supply voltage at the first supply line of 3.3V. If the supply voltage were instead 5.0V, the cascode connection of two transistors 270 and 272 for the circuit 212 could instead be formed by series connection of source-drain paths for three (or more) transistors. Likewise, the pull down circuit using two transistors 248a and 248b could instead be formed by three (or more) transistors.

The circuit 200 of FIG. 16 may be fabricated as an integrated circuit in an implementation where the trigger circuits and switching circuit are implemented in a portion using fully-depleted silicon on insulator (FDSOI) of finFET on SOI technology.

Figure 17:
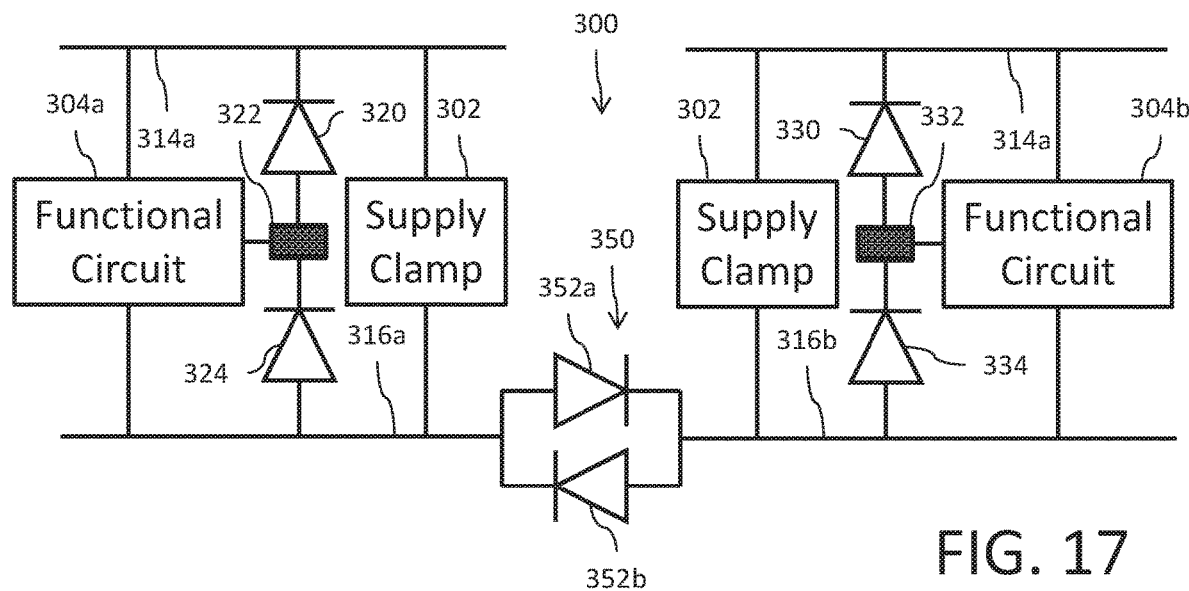
FIG. 17 shows a circuit diagram for an ESD network.

Reference is now made to FIG. 17 showing a ESD network 300 utilizing any one of the supply clamp circuits (generally referenced as 302) as shown by FIGS. 3, 5, 7, 9, 11, 13 and 15-16. An integrated circuit may include multiple power supply domains for functional circuits supported on a common substrate. FIG. 17 shows a configuration with a first power supply domain for a first functional circuit 304a including a first power supply line 314a and a second power supply line 316a, and a second power supply domain for a second functional circuit 304b including a first power supply line 314b and a second power supply line 316b. In this implementation, the first supply line 314a of the first power supply domain may be coupled to a positive power supply pad for the integrated circuit and the second supply line 316a for the first power supply domain may be coupled to a negative or ground power supply pad for the integrated circuit. Likewise, the first supply line 314b of the second power supply domain may be coupled to a positive power supply pad for the integrated circuit and the second supply line 316b for the second power supply domain may be coupled to a negative or ground power supply pad for the integrated circuit. The power supply voltages in the first and second power supply domains are different.

ESD protection circuitry is provided for each power supply domain. That ESD protection circuitry includes a supply clamp circuit 302. Additional ESD protection circuitry for the ESD network 300 includes a first protection diode 320 coupled between a first input/output pad 322 and the first supply line 314a, and a second protection diode 324 coupled between the first input/output pad 322 and the second supply line 316a. The first protection diode 320 has an anode terminal coupled to the input/output pad 322 and a cathode terminal coupled to the first supply line 314a. The second protection diode 324 has a cathode terminal coupled to the first input/output pad 322 and an anode terminal coupled to the second supply line 316a. The input/output pad 322 is coupled to the first functional circuitry 304a of the integrated circuit that is power supplied from the first and second supply lines of the first power supply domain. The additional ESD protection circuitry for the ESD network 300 further includes a third protection diode 330 coupled between a second input/output pad 332 and the first supply line 314b, and a fourth protection diode 334 coupled between the second input/output pad 332 and the second supply line 316b. The third protection diode 330 has an anode terminal coupled to the input/output pad 332 and a cathode terminal coupled to the first supply line 314b. The fourth protection diode 334 has a cathode terminal coupled to the second input/output pad 332 and an anode terminal coupled to the second supply line 316b. The input/output pad 332 is coupled to the second functional circuitry 304b of the integrated circuit that is power supplied from the first and second supply lines of the second power supply domain.

The ESD network further includes a cutter circuit 350 coupled between the second supply line 316a for the first power supply domain and the second supply line 316b for the second power supply domain. The cutter circuit 350 is formed by a pair of diodes 352a and 352b coupled in a back to back (i.e., anti-parallel) configuration. The first diode 352a includes an anode coupled to the second supply line 316a for the first power supply domain and a cathode coupled to the second supply line 316b for the second power supply domain. The second diode 352b includes an anode coupled to the second supply line 3164b for the second power supply domain and a cathode coupled to the second supply line 316a for the first power supply domain.

The implementation of circuits shown in FIG. 17 is equally applicable any configuration of the supply nodes. For example, the circuit of FIG. 17 may be used in connection with: a multiple VDD and multiple ground configuration, a single VDD and multiple ground configuration, a multiple VDD and single ground configuration, and a single VDD and single ground configuration.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An electrostatic discharge (ESD) protection circuit, comprising:
    a first power supply line;
    a second power supply line;
    a functional circuit electrically coupled for power supply to the first and second power supply lines;
    an input/output pad coupled to the functional circuit;
    a first protection diode connected between the input/output pad and the first power supply line;
    a second protection diode connected between the input/output pad and the second power supply line;
    a MOSFET switching circuit having a first conduction terminal connected to the first power supply line, a second conduction terminal connected to the second power supply line, a gate control terminal and a substrate terminal; and
    a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit.

2. The circuit of claim 1, wherein the first conduction terminal of the MOSFET switching circuit is a drain terminal connected to the first power supply line and the second conduction terminal of the MOSFET switching circuit is a source terminal connected to the second power supply line.

3. The circuit of claim 2, wherein the trigger circuit comprises:
    a first resistive-capacitive ESD detection circuit configured to generate the first trigger signal; and
    a second resistive-capacitive ESD detection circuit configured to generate the second trigger signal.

4. The circuit of claim 3, wherein an RC time constant of the second resistive-capacitive ESD detection circuit is smaller than an RC time constant of the first resistive-capacitive ESD detection circuit.

5. The circuit of claim 3, further comprising a signal conditioning circuit coupled between the first resistive-capacitive ESD detection circuit and the gate terminal of the MOSFET switching circuit to condition the first trigger signal.

6. The circuit of claim 2, wherein the trigger circuit comprises:
    a resistive-capacitive ESD detection circuit configured to generate an ESD detection signal;
    a first inverter circuit having an input coupled to receive the ESD detection signal;
    a second inverter circuit having an input coupled to an output of the first inverter circuit and an output configured to generate the first trigger signal; and
    a third inverter circuit having an input coupled to an output of the first inverter circuit and an output configured to generate the second trigger signal.

7. The circuit of claim 6, further comprising a resistor having a first terminal connected to the output of the third inverter and a second terminal connected to the second power supply line.

8. The circuit of claim 2, wherein the trigger circuit comprises:
    a resistive-capacitive ESD detection circuit configured to generate an ESD detection signal; and
    a signal conditioning circuit having an input coupled to receive the ESD detection signal, a first output configured to generate the first trigger signal and a second output configured to generate the second trigger signal.

9. The circuit of claim 8, further comprising a resistor having a first terminal connected to the substrate terminal of the MOSFET switching circuit and a second terminal connected to the second power supply line.

10. The circuit of claim 1, wherein the first conduction terminal of the MOSFET switching circuit is a source terminal connected to the first power supply line and the second conduction terminal of the MOSFET switching circuit is a drain terminal connected to the second power supply line.

11. The circuit of claim 10, wherein the trigger circuit comprises:
   a resistive-capacitive ESD detection circuit configured to generate an ESD detection signal;
   a first inverter circuit having an input coupled to receive the ESD detection signal;
   a second inverter circuit having an input coupled to an output of the first inverter circuit and an output configured to generate the first trigger signal; and
   a first MOSFET device having a first conduction terminal connected to the first power supply line, a second conduction terminal connected to the substrate terminal of the MOSFET switching circuit and a gate terminal coupled to the output of the first inverter circuit.

12. The circuit of claim 11, wherein the first conduction terminal of the first MOSFET device is a drain terminal and the second conduction terminal of the first MOSFET device is a source terminal.

13. The circuit of claim 11, further comprising a second MOSFET device having a first conduction terminal connected to a third power supply line, a second conduction terminal coupled to the substrate terminal of the MOSFET switching circuit through a resistor and a gate terminal coupled to the third power supply line.

14. The circuit of claim 13, wherein a voltage at the third power supply line is greater than a voltage at the first power supply line.

15. The circuit of claim 1, further comprising a MOSFET device having a first conduction terminal connected to the gate control terminal of the MOSFET switching circuit, a second conduction terminal connected to the second power supply line, and a gate terminal connected to the first power supply line.

16. An electrostatic discharge (ESD) protection circuit, comprising:
   a first power supply line;
   a second power supply line;
   a MOSFET switching circuit having a first conduction terminal connected to the first power supply line, a second conduction terminal connected to the second power supply line, a gate control terminal and a substrate terminal; and
   a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit;
   wherein the trigger circuit comprises:
      a first resistive-capacitive ESD detection circuit configured to generate the first trigger signal; and
      a second resistive-capacitive ESD detection circuit configured to generate the second trigger signal.

17. The circuit of claim 16, wherein an RC time constant of the second resistive-capacitive ESD detection circuit is smaller than an RC time constant of the first resistive-capacitive ESD detection circuit.

18. The circuit of claim 16, further comprising a signal conditioning circuit coupled between the first resistive-capacitive ESD detection circuit and the gate terminal of the MOSFET switching circuit to condition the first trigger signal.

19. The circuit of claim 16, wherein the first conduction terminal of the MOSFET switching circuit is a drain terminal connected to the first power supply line and the second conduction terminal of the MOSFET switching circuit is a source terminal connected to the second power supply line.

20. The circuit of claim 16, further comprising a functional circuit electrically coupled for power supply to the first and second power supply lines.

21. The circuit of claim 20, further comprising:
   an input/output pad coupled to the functional circuit;
   a first protection diode connected between the input/output pad and the first power supply line; and
   a second protection diode connected between the input/output pad and the second power supply line.

22. An electrostatic discharge (ESD) protection circuit, comprising:
   a first power supply line;
   a second power supply line;
   a MOSFET switching circuit having a first conduction terminal connected to the first power supply line, a second conduction terminal connected to the second power supply line, a gate control terminal and a substrate terminal; and
   a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit;
   wherein the trigger circuit comprises:
      a resistive-capacitive ESD detection circuit configured to generate an ESD detection signal;
      a first inverter circuit having an input coupled to receive the ESD detection signal;
      a second inverter circuit having an input coupled to an output of the first inverter circuit and an output configured to generate the first trigger signal; and
      a third inverter circuit having an input coupled to an output of the first inverter circuit and an output configured to generate the second trigger signal.

23. The circuit of claim 22, further comprising a resistor having a first terminal connected to the output of the third inverter and a second terminal connected to the second power supply line.

24. The circuit of claim 22, wherein the first conduction terminal of the MOSFET switching circuit is a drain terminal connected to the first power supply line and the second conduction terminal of the MOSFET switching circuit is a source terminal connected to the second power supply line.

25. The circuit of claim 22, further comprising a functional circuit electrically coupled for power supply to the first and second power supply lines.

26. The circuit of claim 25, further comprising:
   an input/output pad coupled to the functional circuit;
   a first protection diode connected between the input/output pad and the first power supply line; and
   a second protection diode connected between the input/output pad and the second power supply line.

27. An electrostatic discharge (ESD) protection circuit, comprising:
   a first power supply line;
   a second power supply line;
   a MOSFET switching circuit having a first conduction terminal connected to the first power supply line, a second conduction terminal connected to the second power supply line, a gate control terminal and a substrate terminal; and a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit;

wherein the trigger circuit comprises:

a resistive-capacitive ESD detection circuit configured to generate an ESD detection signal; and a signal conditioning circuit having an input coupled to receive the ESD detection signal, a first output configured to generate the first trigger signal and a second output configured to generate the second trigger signal.

28. The circuit of claim 27, further comprising a resistor having a first terminal connected to the substrate terminal of the MOSFET switching circuit and a second terminal connected to the second power supply line.

29. The circuit of claim 27, wherein the first conduction terminal of the MOSFET switching circuit is a drain terminal connected to the first power supply line and the second conduction terminal of the MOSFET switching circuit is a source terminal connected to the second power supply line.

30. The circuit of claim 27, further comprising a functional circuit electrically coupled for power supply to the first and second power supply lines.

31. The circuit of claim 30, further comprising:

an input/output pad coupled to the functional circuit;

a first protection diode connected between the input/output pad and the first power supply line; and a second protection diode connected between the input/output pad and the second power supply line.

32. An electrostatic discharge (ESD) protection circuit, comprising:

a first power supply line;

a second power supply line;

a MOSFET switching circuit having a first conduction terminal connected to the first power supply line, a second conduction terminal connected to the second power supply line, a gate control terminal and a substrate terminal; and a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit;

wherein the trigger circuit comprises:

a resistive-capacitive ESD detection circuit configured to generate an ESD detection signal;

a first inverter circuit having an input coupled to receive the ESD detection signal;

a second inverter circuit having an input coupled to an output of the first inverter circuit and an output configured to generate the first trigger signal; and a first MOSFET device having a first conduction terminal connected to the first power supply line, a second conduction terminal connected to the substrate terminal of the MOSFET switching circuit and a gate terminal coupled to the output of the first inverter circuit.

33. The circuit of claim 32, wherein the first conduction terminal of the first MOSFET device is a drain terminal and the second conduction terminal of the first MOSFET device is a source terminal.

34. The circuit of claim 33, wherein the first conduction terminal of the MOSFET switching circuit is a source terminal connected to the first power supply line and the second conduction terminal of the MOSFET switching circuit is a drain terminal connected to the second power supply line.

35. The circuit of claim 32, further comprising a second MOSFET device having a first conduction terminal connected to a third power supply line, a second conduction terminal coupled to the substrate terminal of the MOSFET switching circuit through a resistor and a gate terminal coupled to the third power supply line.

36. The circuit of claim 35, wherein a voltage at the third power supply line is greater than a voltage at the first power supply line.

37. The circuit of claim 32, further comprising a functional circuit electrically coupled for power supply to the first and second power supply lines.

38. The circuit of claim 37, further comprising:

an input/output pad coupled to the functional circuit;

a first protection diode connected between the input/output pad and the first power supply line; and a second protection diode connected between the input/output pad and the second power supply line.

39. An electrostatic discharge (ESD) protection circuit, comprising:

a first power supply line;

a second power supply line;

a MOSFET switching circuit having a first conduction terminal connected to the first power supply line, a second conduction terminal connected to the second power supply line, a gate control terminal and a substrate terminal;

a trigger circuit configured to generate, in response to detection of an ESD event at one or more of the first and second power supply lines, a first trigger signal for application to the gate terminal of the MOSFET switching circuit and a second trigger signal for application to the substrate terminal of the MOSFET switching circuit; and a MOSFET device having a first conduction terminal connected to the gate control terminal of the MOSFET switching circuit, a second conduction terminal connected to the second power supply line, and a gate terminal connected to the first power supply line.

40. The circuit of claim 39, further comprising a functional circuit electrically coupled for power supply to the first and second power supply lines.

41. The circuit of claim 40, further comprising:

an input/output pad coupled to the functional circuit;

a first protection diode connected between the input/output pad and the first power supply line; and a second protection diode connected between the input/output pad and the second power supply line.

* * * * *